US012785359B2

(12) United States Patent
Oe et al.

(10) Patent No.: US 12,785,359 B2
(45) Date of Patent: Nov. 3, 2026

(54) WAVELENGTH TUNABLE LASER APPARATUS, OPTICAL TRANSCEIVER, AND WAVELENGTH CONTROL METHOD

(71) Applicant: NEC Corporation, Tokyo (JP)

(72) Inventors: Masaki Oe, Tokyo (JP); Kenji Mizutani, Tokyo (JP)

(73) Assignee: NEC CORPORATION, Tokyo (JP)

( * ) Notice: Subject to any disclaimer, the term of this patent is extended or adjusted under 35 U.S.C. 154(b) by 250 days.

(21) Appl. No.: 18/700,787

(22) PCT Filed: Nov. 12, 2021

(86) PCT No.: PCT/JP2021/041697
§ 371 (c)(1),
(2) Date: Apr. 12, 2024

(87) PCT Pub. No.: WO2023/084730
PCT Pub. Date: May 19, 2023

(65) Prior Publication Data
US 2024/0429678 A1 Dec. 26, 2024

(51) Int. Cl.
*H01S 5/06* (2006.01)
*H04B 10/43* (2013.01)

(52) U.S. Cl.
CPC ........... *H01S 5/0612* (2013.01); *H04B 10/43* (2013.01)

(58) Field of Classification Search
CPC ............. H01S 5/02415; H01S 5/02453; H01S 5/0261; H01S 5/0265; H01S 5/0612; H01S 5/0617; H01S 5/06256; H01S 5/0687; H01S 5/14; H04B 10/43; C08F 212/30; C08F 220/06; C08F 220/585; C08F 222/06; G01N 2333/4737; G01N 33/54393; G01N 33/6863; G02B 6/12; G02F 1/01; H01T 13/38; H01T 21/02; Y02E 60/10
See application file for complete search history.

(56) References Cited

U.S. PATENT DOCUMENTS 6,211,999 B1 4/2001 Gopalan et al.
9,444,221 B2 * 9/2016 Uesaka .................. H01S 5/125
(Continued)

FOREIGN PATENT DOCUMENTS

JP 2002-109770 A 4/2002
JP 2002-152139 A 5/2002
(Continued)

OTHER PUBLICATIONS

International Search Report for PCT Application No. PCT/JP2021/041697, mailed on Feb. 1, 2022.

*Primary Examiner* — David C Payne
*Assistant Examiner* — Mohammed Abdelraheem

(57) ABSTRACT

A wavelength tunable laser apparatus (10) comprises: a semiconductor optical amplifier (121) that outputs light due to supplied power; a heater (124) that controls a wavelength of the light output from the semiconductor optical amplifier by performing heating due to the supplied power; and a control unit (11) in configured to control power, the power being supplied to the heater, in which the control unit determines, based on the wavelength of the light output from the wavelength tunable laser apparatus, a target value of the power to be supplied to the heater and transition of the power to be supplied to the heater until the target value is reached.

7 Claims, 10 Drawing Sheets

(56) References Cited

U.S. PATENT DOCUMENTS

| | | | | | |
|---|---|---|---|---|---|
| 2009/0022185 | A1* | 1/2009 | Machida | H01S 5/06256 | 372/20 |
| 2009/0161113 | A1* | 6/2009 | Chen | G02B 6/12007 | 356/477 |
| 2011/0013654 | A1* | 1/2011 | Yamazaki | H01S 5/0687 | 372/29.02 |
| 2011/0228800 | A1* | 9/2011 | Tanaka | H01S 5/06258 | 372/20 |
| 2011/0293279 | A1* | 12/2011 | Lam | H04J 14/0305 | 398/79 |
| 2012/0314989 | A1* | 12/2012 | Chou | G02B 6/428 | 385/14 |
| 2016/0006212 | A1* | 1/2016 | Uesaka | H01S 5/06837 | 372/20 |
| 2020/0280173 | A1* | 9/2020 | Gao | H01S 5/02415 | |

FOREIGN PATENT DOCUMENTS

| | | | | |
|---|---|---|---|---|
| JP | 2014-531622 | A | | 11/2014 |
| JP | 2016-015454 | A | | 1/2016 |
| JP | 6241931 | B | | 12/2017 |
| JP | 2019-040099 | A | | 3/2019 |
| JP | 2019-140303 | | | 8/2019 |
| JP | 2020136360 | A | * | 8/2020 |

* cited by examiner

601

| CHANNEL ID | WAVELENGTH | TARGET VALUE | TRANSITION |
|---|---|---|---|
| CHANNEL A | WAVELENGTH A | TARGET VALUE A | TRANSITION A |
| CHANNEL B | WAVELENGTH B | TARGET VALUE B | TRANSITION B |
| . . . | . . . | . . . | . . . |

Fig. 6

WAVELENGTH TUNABLE LASER APPARATUS, OPTICAL TRANSCEIVER, AND WAVELENGTH CONTROL METHOD

This application is a National Stage Entry of PCT/JP2021/041697 filed on Nov. 12, 2021, the contents of all of which are incorporated herein by reference, in their entirety.

TECHNICAL FIELD

The present disclosure relates to a wavelength tunable laser apparatus, an optical transceiver, and a wavelength control method.

BACKGROUND ART

A wavelength tunable laser apparatus capable of outputting optical signals of a plurality of wavelengths is used as a light source for Wavelength Division Multiplex (WDM) or the like, in which communication is performed by multiplexing optical signals of a plurality of wavelengths on a single optical fiber cable.

In connection with this technique, Patent Literature 1 discloses a wavelength tunable light source (a wavelength tunable laser apparatus) and an optical transceiver that extracts light of a desired wavelength and transmits and receives information using silicon photonics (Silicon Photonics), which is a technique for integrating various elements on a silicon substrate.

According to Patent Literature 1, the light output from the SOA (Semiconductor Optical Amplifier) 51 is passed from a Si waveguide through a waveguide type wavelength filter (two ring resonators), has its phase controlled by a phase controller (a heater), and reflected by a partial reflection mirror. Then, due to the multiple reflection between the high reflection film and the partial reflection mirror of the SOA 51 and the phase control performed by the phase controller, intensity-enhanced and phase-aligned light is passes through the partial reflection mirror, and input from the Si waveguide to the SOA 52. Then, the light amplified from the SOA 52 is output. In Patent Literature 1, when the heater is energized and heated, the refractive index is changed due to the thermo-optical effect of Si, and the resonance wavelength of the ring resonator is changed accordingly. Thus, Patent Literature 1 discloses that the transmission wavelength can be controlled.

CITATION LIST

Patent Literature

Patent Literature 1: Japanese Unexamined Patent Application Publication No. 2019-040099

SUMMARY OF INVENTION

Technical Problem

However, in the case where a filter, a waveguide, or the like is formed using silicon photonics, as in the technique described in Patent Literature 1, the wavelength of the light output to the outside may not be appropriately controlled.

The present disclosure has been made in view of the aforementioned problem and an object of the present disclosure is to provide a wavelength tunable laser apparatus, an optical transceiver, and a wavelength control method each adapted to appropriately control the wavelength of a light output to the outside.

Solution to Problem

According to a first aspect of the present disclosure, a wavelength tunable laser apparatus includes:

- a semiconductor optical amplifier that outputs light due to supplied power;
- a heater that controls a wavelength of the light output from the semiconductor optical amplifier by performing heating due to the supplied power; and
- a control unit configured to control power, the power being supplied to the heater,
- wherein the control unit determines, based on the wavelength of the light output from the wavelength tunable laser apparatus, a target value of the power to be supplied to the heater and transition of the power to be supplied to the heater until the target value is reached.

According to a second aspect of the present disclosure, an optical transceiver includes:

- an optical receiver module for receiving an optical signal;

a wavelength tunable laser apparatus;

- an optical cable interface for transmitting light from the wavelength tunable laser apparatus;
- an electrical interface for transmitting and receiving electrical signals; and
- a transmission control unit configured to convert an optical signal into an electrical signal to be output from the electrical interface when the optical signal is received by the optical receiver module, and convert an electrical signal into an optical signal to be output from the optical cable interface when the electrical signal is received by the electrical interface,
- wherein the wavelength tunable laser apparatus includes:
  - a semiconductor optical amplifier that outputs light due to the supplied power;
  - a heater that controls a wavelength of the light output from the semiconductor optical amplifier by performing heating due to the supplied power; and
  - a control unit configured to control power, the power being supplied to the heater,
- wherein the control unit determines, based on the wavelength of the light output from the wavelength tunable laser apparatus, a target value of the power to be supplied to the heater and transition of the power to be supplied to the heater until the target value is reached.

According to a third aspect of the present disclosure, a wavelength control method includes:

- causing a wavelength tunable laser apparatus that includes:
  - a semiconductor optical amplifier that outputs light due to supplied power; and
  - a heater that controls a wavelength of the light output from the semiconductor optical amplifier by performing heating due to the supplied power
- perform processes of:
  - determining, based on the wavelength of the light output from the wavelength tunable laser apparatus, a target value of the power to be supplied to the heater and transition of the power to be supplied to the heater until the target value is reached; and
  - supplying power to the heater based on the determined transition.

Advantageous Effects of Invention

According to an aspect of the present disclosure, the wavelength of a light output to the outside can be appropriately controlled.

BRIEF DESCRIPTION OF DRAWINGS

FIG. 6 is a diagram illustrating an example of data recorded in a configuration table according to an example embodiment;

EXAMPLE EMBODIMENT

The principles of the present disclosure will be described with reference to some exemplary example embodiments. It should be understood that these example embodiments are described for illustrative purposes only and are intended to assist those skilled in the art in understanding and implementing the present disclosure without implying any limitations on the scope of the present disclosure.

The disclosure given herein may be implemented in a variety of ways other than those described below. In the following description and claims, unless otherwise defined, all technical and scientific terms used herein have the same meanings as are generally understood by those skilled in the art to which the present disclosure pertains.

Example embodiments of the present disclosure will be described hereinafter with reference to the drawings.

First Example Embodiment

<Configuration>

Figure 1A:
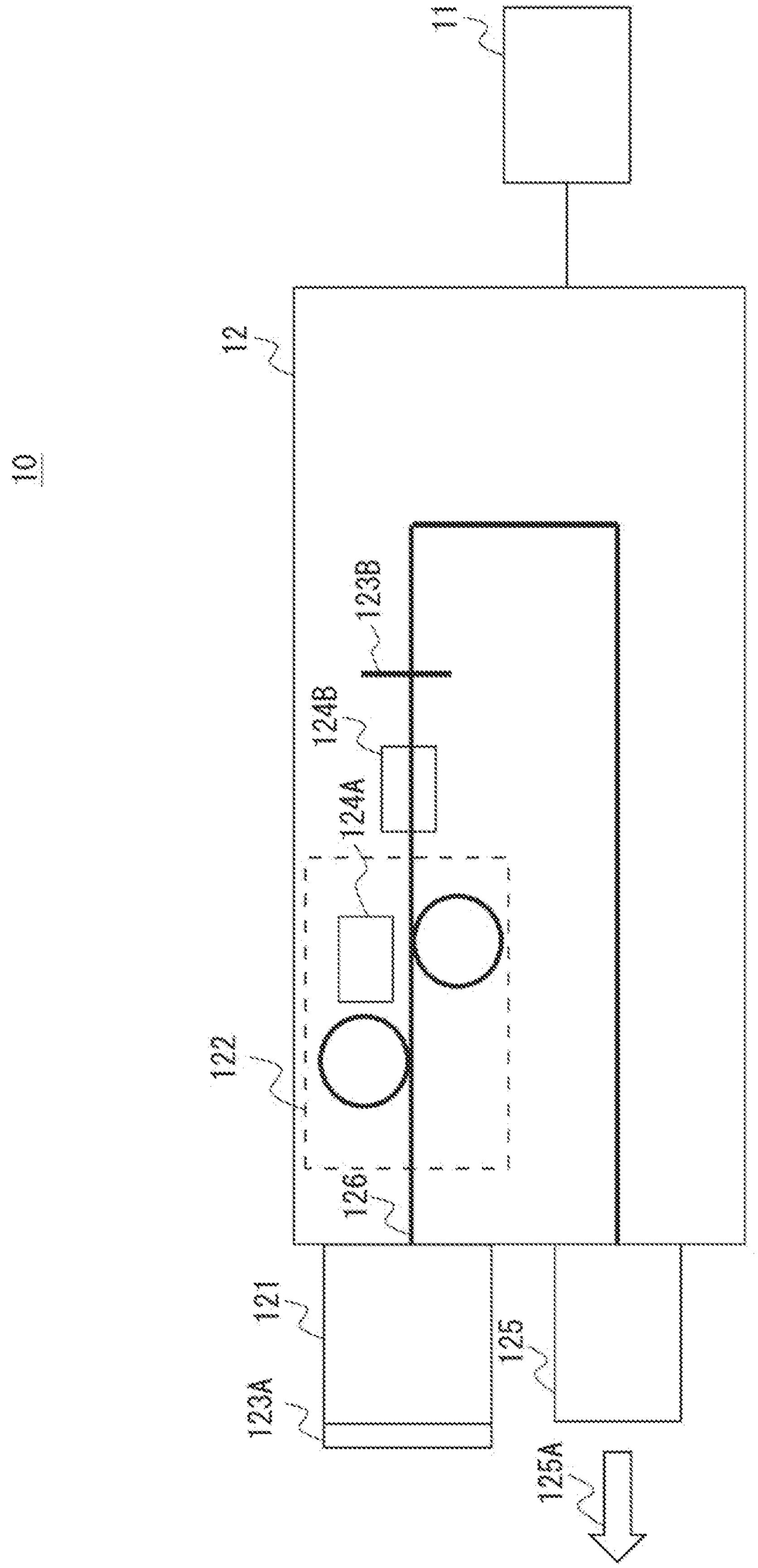
FIG. 1A is a diagram illustrating an example of a configuration of a wavelength tunable laser apparatus according to an example embodiment.

A configuration of a wavelength tunable laser apparatus 10 according to an example embodiment will be described with reference to FIG. 1A. FIG. 1A is a diagram showing an example of a configuration of the wavelength tunable laser apparatus 10 according to an example embodiment. The wavelength tunable laser apparatus 10 includes a control unit 11 and a wavelength tunable light source unit 12. The control unit 11 and the wavelength tunable light source unit 12 may be housed in the same cabinet. In addition, the control unit 11 and the wavelength tunable light source unit 12 may be connected to each other so as to be able to communicate with each other through a cable or the like.

The wavelength tunable light source unit 12 may be used, for example, as a light source for Wavelength Division Multiplex (WDM) or the like, which multiplexes optical signals of a plurality of wavelengths onto a single optical cable for performing communication.

In the example illustrated in FIG. 1A, the wavelength tunable light source unit 12 includes a semiconductor optical amplifier 121, a resonator 122, a mirror 123A, a mirror 123B, a heater 124A, a heater 124B, a semiconductor optical amplifier 125, and a waveguide 126. In the following, when it is not necessary to make a distinction between the heater 124A and the heater 124B, and where appropriate, at least one of the heaters 124A and 124B is simply referred to as "the heater 124".

The wavelength tunable light source unit 12 may be implemented, for example, in silicon photonics (an optical circuit using a silicon semiconductor), which is a technique for integrating various elements on a silicon substrate. Thus, the wavelength tunable light source unit 12 can be miniaturized. Since the silicon material can obtain a large refractive index change even with a small temperature change compared with the quartz material, the heating power of the heater 124 can be reduced. Therefore, the power saving can be realized. In this case, for example, the semiconductor optical amplifier 121, the resonator 122, the semiconductor optical amplifier 125, and the waveguide 126 may be formed of silicon on a silicon substrate by etching or the like. The waveguide 126 formed of silicon may be referred to as a "silicon optical waveguide". The heater 124, the mirror 123 A, and the mirror 123B may be formed of a material other than silicon by, for example, extrapolation or baking.

The semiconductor optical amplifier 121 is a SOA (Semiconductor Optical Amplifier) that outputs due to the supplied power. The semiconductor optical amplifier 121 outputs light for a light source. The mirror 123A is provided on one end face side of the semiconductor optical amplifier 121 and reflects light to the other end side of the semiconductor optical amplifier 121.

The resonator 122 is a filter for extracting light of a specific wavelength. The resonator 122 may be, for example, a vernier type variable wavelength filter using two ring resonators. A ring resonator is, for example, an optical circuit formed in a ring shape, in which only light having a specific wavelength among the light input from one straight waveguide is output from the other waveguide. The resonator 122 may be a filter for extracting light having a specific wavelength, and is not limited to an example of using two ring resonators.

The mirror 123B may be, for example, a partially reflective mirror. The heater 124A heats the resonator 122 due to the supplied power. The heater 124B heats at least a part of the waveguide 126 between the semiconductor optical amplifier 121 and the semiconductor optical amplifier 125 due to the supplied power. The heater 124 controls the wavelength of the light output from the semiconductor optical amplifier 121 by changing the refractive index of the heated part. The number of heaters 124 is not limited to the example illustrated in FIG. 1A. The semiconductor optical amplifier 125 amplifies the light thereto and outputs the light 125A from the wavelength tunable light source unit 12.

The control unit 11 controls the power supplied from a power source (not shown) to each part of the wavelength tunable light source unit 12. The control unit 11 may, for example, supply power to the semiconductor optical amplifier 121, the heater 124, and the semiconductor optical amplifier 125 according to the intensity and wavelength of the light output to the wavelength tunable light source unit 12.

The control unit 11 transmits light of a specific wavelength to the resonator 122 by heating the resonator 122 with the heater 124B. The control unit 11 then outputs light from the semiconductor optical amplifier 121. The output light passes through the resonator 122, is phase-controlled by the heater 124B serving as a phase controller, and is reflected by the mirror 123B. By multiple reflections between the mirrors 123A and 123B and the phase control performed by the heater 124B, intensity-enhanced and phase-aligned light passes through the mirror 123B and is output from the semiconductor optical amplifier 125.

Based on the wavelength of the light to be output from the wavelength tunable light source unit 12 (the semiconductor optical amplifier 125), the control unit 11 determines the target value of the power to be supplied to the heater 124 and transition of the power be supplied to the heater 124 until the target value is reached. Then, the control unit 11 supplies power from the power source to the heater based on the determined transition of power supply.

Modified Example

Figure 1B:
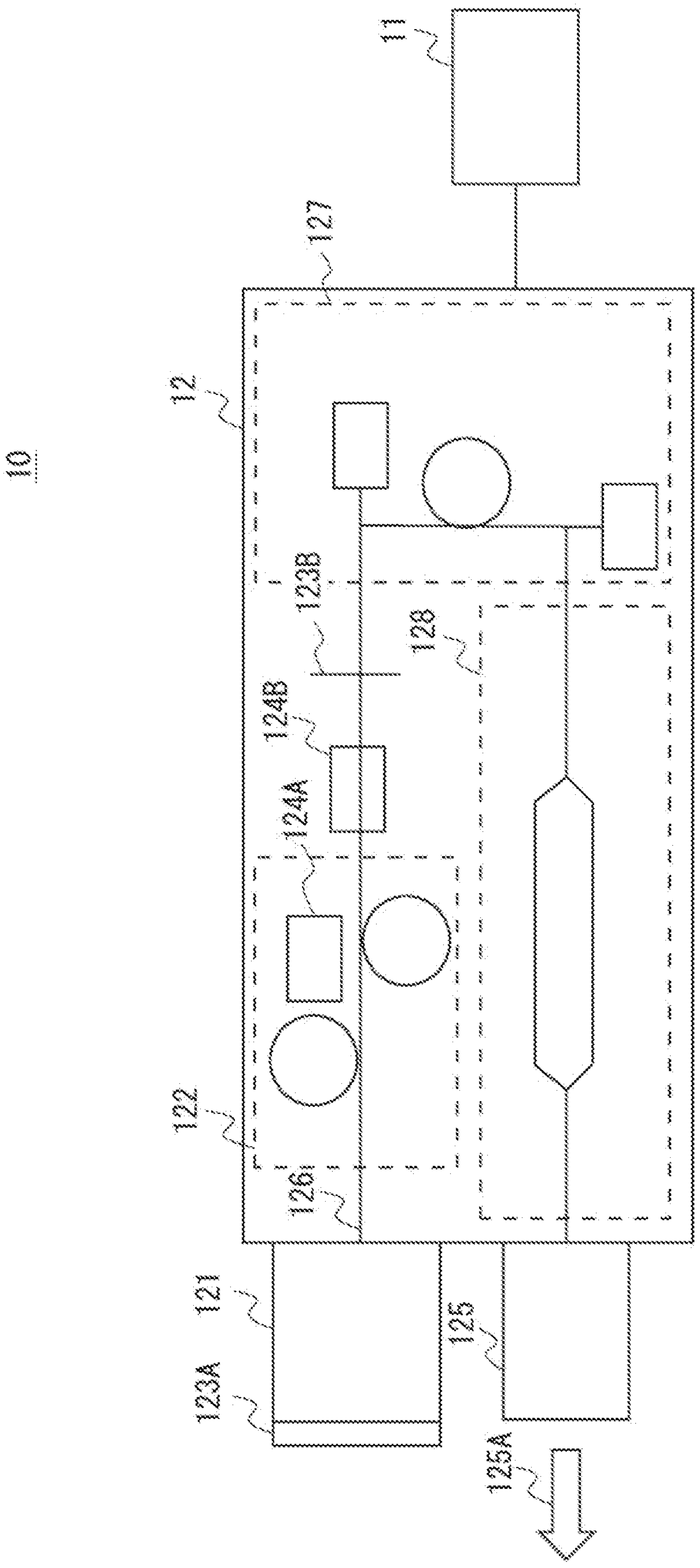
FIG. 1B is a diagram illustrating an example of a configuration of a wavelength tunable laser apparatus according to an example embodiment.

FIG. 1B is a diagram showing an example of a configuration of the wavelength tunable laser apparatus 10 according to an example embodiment. The example illustrated in FIG. 1B differs from the example illustrated in FIG. 1A in that the wavelength tunable light source unit 12 includes a wavelength locker 127 and a modulator 128. Similarly to the example illustrated in FIG. 1A, the wavelength tunable light source unit 12 of FIG. 1B may also be implemented in a silicon photonics (optical circuit using a silicon semiconductor), which is a technique for integrating various elements on a silicon substrate, for example.

The wavelength locker 127 fixes the frequency (oscillation frequency) of the light output from the wavelength tunable light source unit 12 at the frequency specified by the control unit 11. The wavelength locker 127 may, for example, have a mechanism for detecting the transmittance of light that has passed through a wavelength filter having a periodic transmittance relative to the frequency. Based on the transmittance detected by the wavelength locker 127, the control unit 11 may decide whether the oscillation frequency is different from the specified frequency. If the oscillation frequency is different from the specified frequency, the control unit 11 may control the heater 124 so that the difference between the oscillation frequency and the specified frequency is reduced.

The modulator 128 continuously changes the amplitude, phase, etc. of the optical signal in accordance with an instruction from the control unit 11. The modulator 128 may be, for example, an MZ (Mach-Zender) modulator having an element (Mach-Zender type interferometer) in which a light beam having the same wavelength and phase is divided (demultiplexed) into a pair of two light beams, each of which is given a different phase and then combined (merged). In this case, the control unit 11 may, for example, cause the two light beams to differ in phase by applying a current to the waveguide 126 to change the refractive index. It should be noted that the intensity of the combined light beams varies depending on the difference in the phase of the light beams. The maximum intensity is reached when the phase difference is 0 or $2\pi$ (360 degrees). The minimum intensity is reached when the phase difference is $\pi$ (180 degrees).

Second Example Embodiment

Next, the configuration of the communication system 1 according to an example embodiment will be described with reference to FIG. 2.

<System Configuration>

Figure 2:
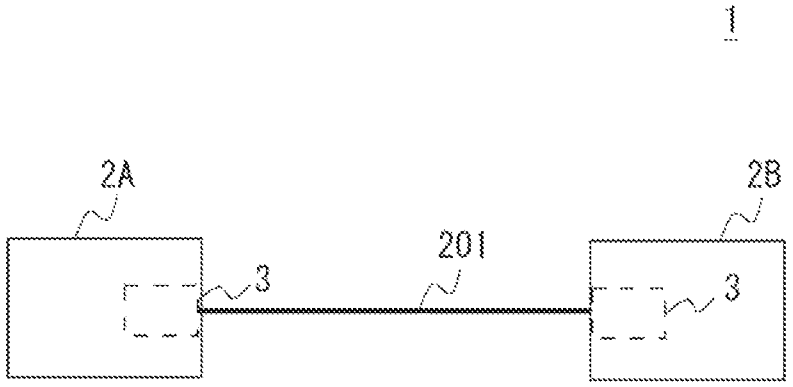
FIG. 2 is a diagram showing a configuration example of a communication system according to an example embodiment.

FIG. 2 is a diagram showing a configuration example of the communication system 1 related to example embodiment. In FIG. 2, the communication system 1 includes a communication apparatus 2A and a communication apparatus 2B (hereinafter, when it is not necessary to make a distinction between the communication apparatuses 2A and 2B, the communication apparatuses 2A and 2B are simply referred to as the "communication apparatus 2"). The number of communication apparatuses 2 is not limited to the example illustrated in FIG. 2. The communication apparatus 2 includes an optical transceiver 3 that converts optical signals into electrical signals and vice versa. The communication apparatus 2A and the communication apparatus 2B are connected by an optical communication path 201 such as an optical fiber cable, for example, to enable optical communication.

The communication apparatus 2A and the communication apparatus 2B may be, for example, a base station and an exchange station of a wireless communication system, respectively. In this case, the radio access technology (RAT) of the wireless communication system may include, for example, a 6th generation mobile communication system (6G, Beyond 5G), 5G, 4G, LTE (Long Term Evolution), wireless LAN, etc.

The communication apparatus 2A and the communication apparatus 2B may each be, for example, an optical line terminating device (ONU, Optical Network Unit) that converts optical signals into electrical signals and vice versa. The communication apparatus 2A and the communication apparatus 2B may be, for example, optical switches that switch the communication path of the optical signals.

<Configuration of Optical Transceiver 3>

Figure 3:
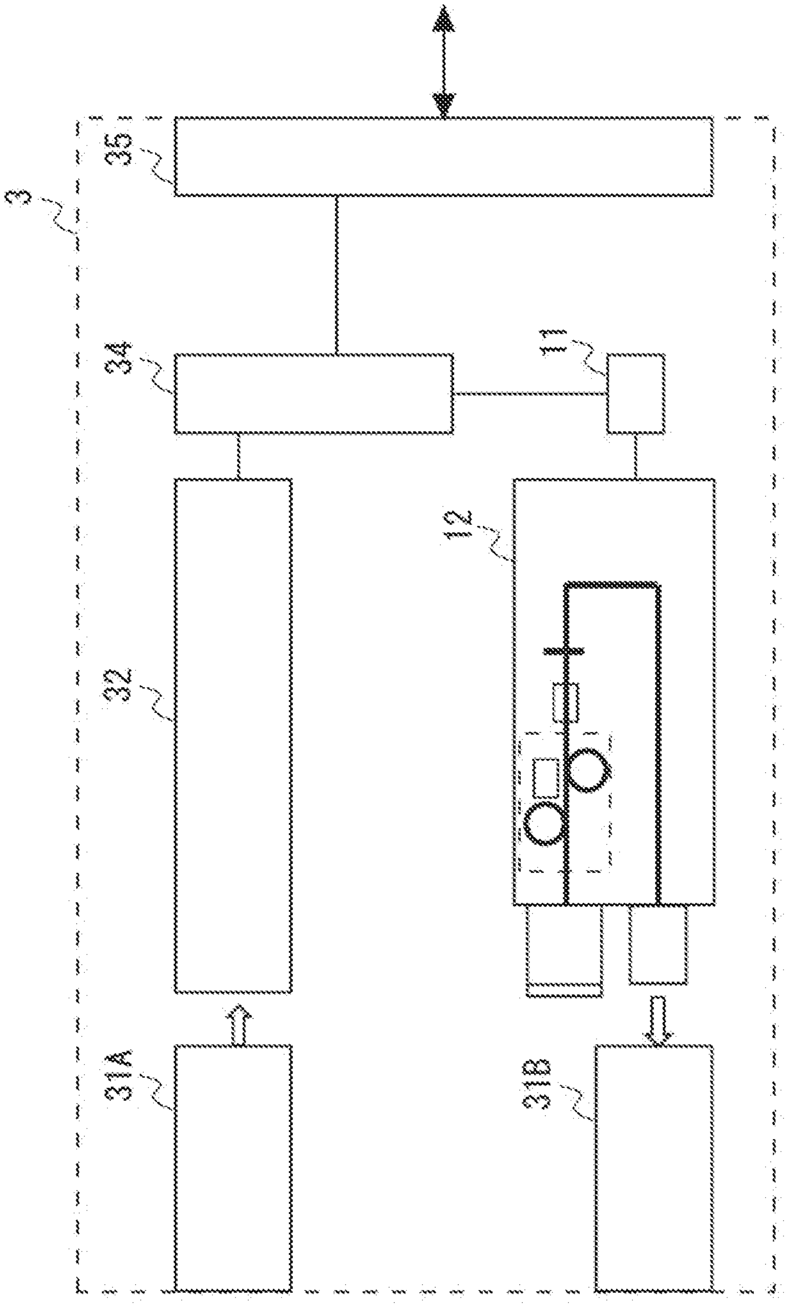
FIG. 3 is a diagram showing a configuration example of an optical transceiver according to an example embodiment.

FIG. 3 is a diagram showing a configuration example of the optical transceiver 3 according to an example embodiment. In the example illustrated in FIG. 3, the optical transceiver 3 may be, for example, an SFP transceiver (small form-factor pluggable transceiver) conforming to a predetermined standard.

In the example illustrated in FIG. 3, the optical transceiver 3 includes an optical cable interface 31A, an optical cable interface 31B, an optical receiver module 32, the wavelength tunable light source unit 12, a transmission control unit 34, the control unit 11, and an electrical interface 35.

The optical cable interface 31A outputs light received from an external apparatus via an optical cable to the optical receiver module 32. The optical receiver module 32 converts the optical signal of the received light into an electrical signal and outputs it to the transmission control unit 34. The transmission control unit 34 outputs an electrical signal in accordance with the electrical signal input from the optical receiver module 32 via the electrical interface 35.

The transmission control unit 34 outputs an electrical signal in accordance with the electrical signal received via the electrical interface 35 to the control unit 11. The control unit 11 controls the wavelength tunable light source unit 12 in accordance with the electrical signal from the transmission control unit 34 and have an optical signal corresponding to the electrical signal output from the optical cable interface 31B.

<Hardware Configuration>

Figure 4:
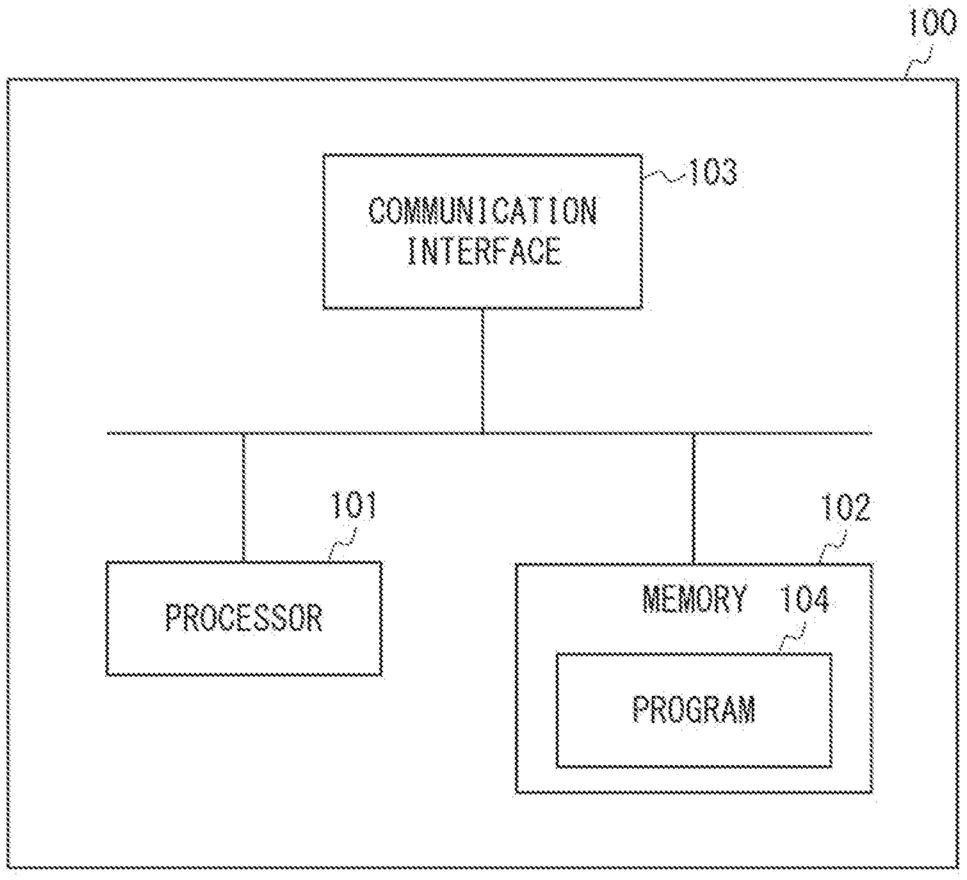
FIG. 4 is a diagram showing a hardware configuration example of a control unit according to an example embodiment.

FIG. 4 is a diagram showing a hardware configuration example of the control unit 11 according to an example embodiment. The hardware configuration of the transmission control unit 34 may be the same as that of the control unit 11. In the example illustrated in FIG. 4, the control unit 11 (a computer 100) includes a processor 101, a memory 102, and a communication interface 103. These components may be connected by a bus or the like. The memory 102 stores at least a part of a program 104. The communication interface 103 includes interfaces necessary for establishing communication with other network elements.

When the program 104 is executed by the cooperation of the processor 101, the memory 102, and the like, the computer 100 performs at least a part of the example embodiments of the present disclosure. The memory 102 may be of any type suitable for a local technical network. The memory 102 may, as a non-limiting example, be a non-transitory computer readable storage medium. The memory 102 may also be implemented using any suitable data storage technique, such as semiconductor-based memory devices, magnetic memory devices and systems, optical memory devices and systems, and fixed and removable memories. Although the computer 100 shown has only one memory 102, the computer 100 may have several physically distinct memory modules. The processor 101 may be of any type. The processor 101 may include one or more of the following: a general-purpose computer, a dedicated computer, a microprocessor, a digital signal processor (DSP), and, as a non-limiting example, a processor based on a multi-core processor architecture. The computer 100 may include multiple processors such as an application-specific integrated circuit chip that is temporally dependent on a clock that synchronizes the main processor.

Example embodiments of the present disclosure may be implemented in hardware or dedicated circuitry, software, logic or any combination thereof. Some aspects may be implemented in hardware, while others may be implemented in firmware or software that may be executed by a controller, a microprocessor or other computing devices.

The present disclosure also provides at least one computer program product that is tangibly stored on a non-transitory computer readable storage medium. The computer program product includes computer executable instructions, such as instructions contained in a program module, and is executed on a device on a target real processor or a virtual processor to implement the process or the method of the present disclosure. A program module includes routines, programs, libraries, objects, classes, components, data structures, and the like that perform a specific task or implement a specific abstract data type. The functions of a program module may be combined or divided among the program modules as desired in various example embodiments. The machine executable instructions of a program module may be executed locally or within a distributed device. In a distributed device, program modules may be located on both local and remote storage media.

Program codes for implementing the methods of the present disclosure may be written in any combination of one or more programming languages. These program codes may be provided to a processor or a controller of a general-purpose computer, a dedicated computer, or other programmable data processing device. When the program codes are executed by a processor or a controller, the functions/operations in the flowchart and/or the block diagram are executed. The program code is executed entirely on a machine, partly on a machine as a stand-alone software package, or partly on a machine and partly on a remote machine, or entirely on a remote machine or a server.

Programs can be stored and supplied to a computer using various types of non-transitory computer-readable medium. Non-transitory computer-readable medium includes various types of substantial recording media. Examples of non-transitory computer-readable medium include magnetic recording media, magneto-optical recording media, optical disk media, semiconductor memory, etc. Magnetic recording media include, for example, flexible disks, magnetic tapes, hard disk drives, etc. Magneto-optical recording media include, for example, magneto-optical disks, etc. Optical disk media include, for example, Blu-ray disks, compact disc (CD)-ROM (Read Only Memory), CD-R (Recordable), CD-RW (ReWritable), etc. Semiconductor memory includes, for example, mask ROM, PROM (Programmable ROM), EPROM (Erasable PROM), flash ROM, RAM (random access memory), etc. Programs may also be supplied to the computer by various types of transitory computer-readable medium. Examples of transitory computer-readable medium include electrical signals, optical signals, and electromagnetic waves. A transitory computer-readable medium may supply programs to a computer via a wired or wireless channel, such as an electric wire and optical fiber.

<Processing>

Figure 5:
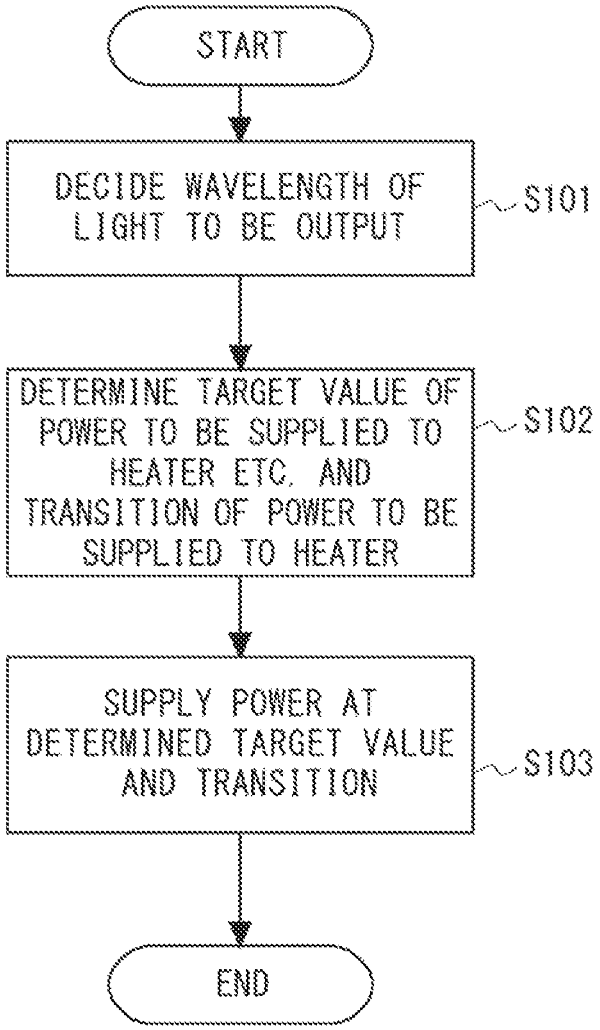
FIG. 5 is a sequence diagram illustrating an example of processing of a control unit according to an example embodiment.
Figure 7:
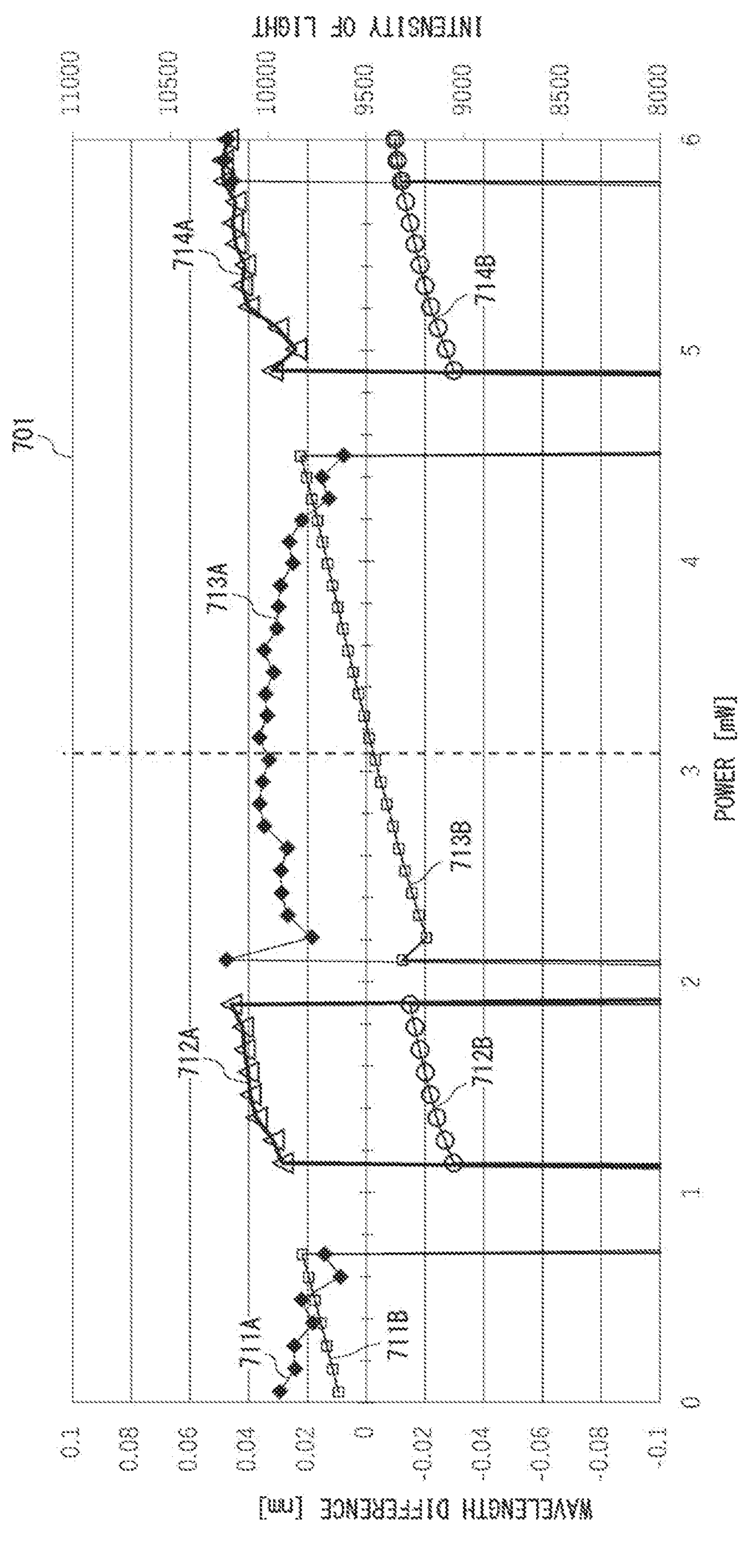
FIG. 7 is a diagram illustrating an example of wavelengths of light output when power is supplied to a heater 124 based on each of a plurality of transitions.
Figure 8:
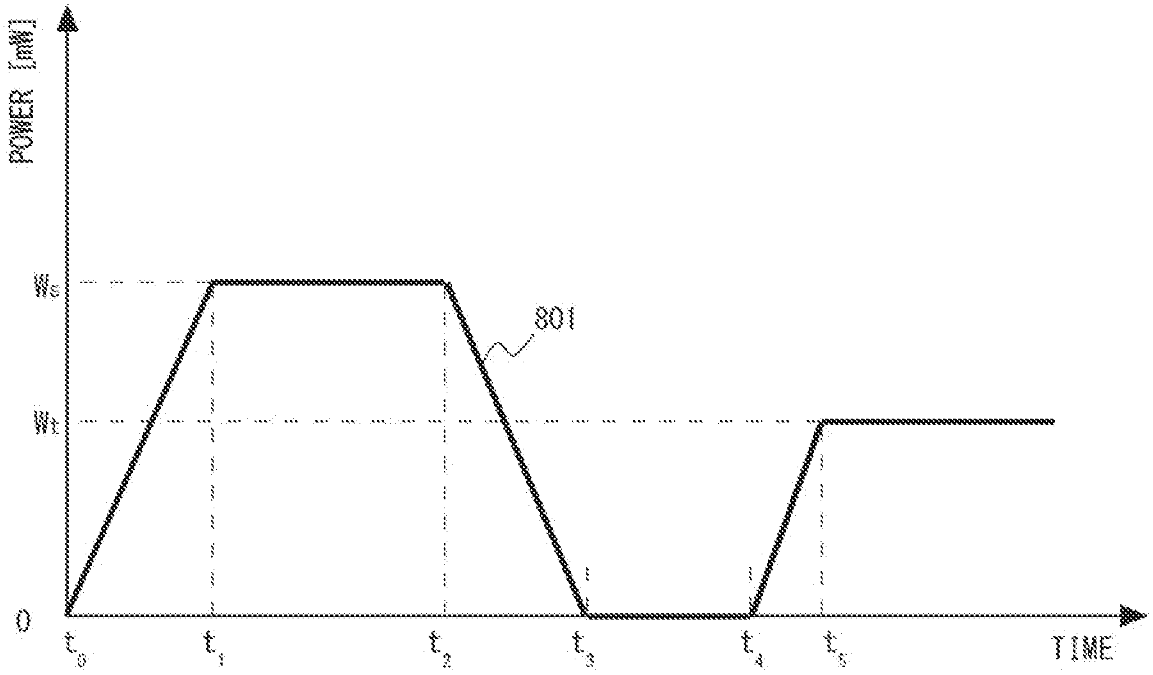
FIG. 8 is a diagram illustrating an example in which a power value transitions from a value lower than a target value Wt to the target value Wt according to an example embodiment.
Figure 9:
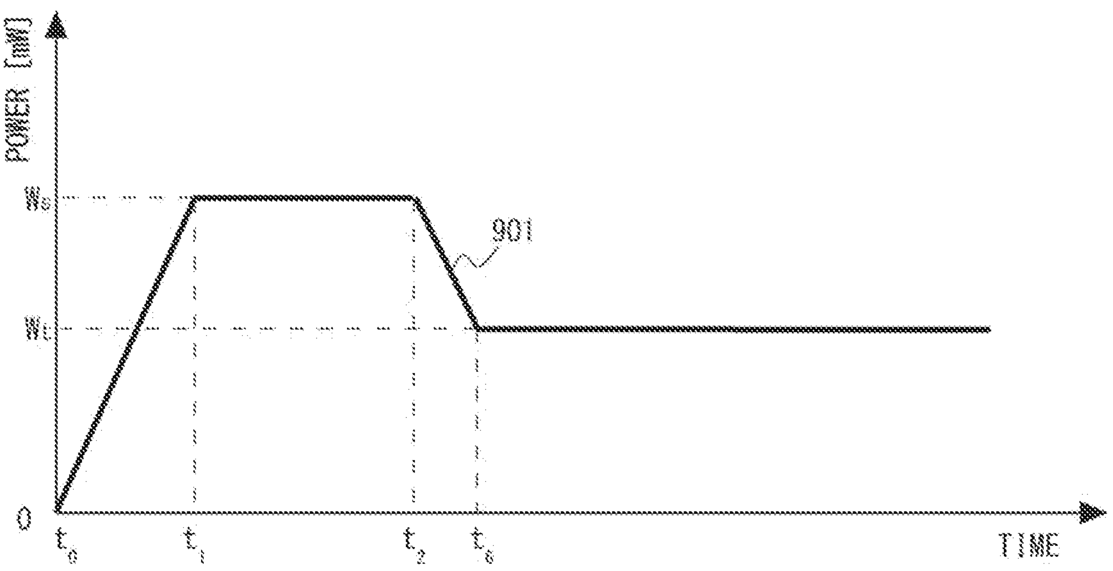
FIG. 9 is a diagram illustrating an example in which a power value transitions from a value higher than a target value Wt to the target value Wt according to an example embodiment.

An example of processing of the control unit 11 according to an example embodiment will be described with reference to FIGS. 5 to 9. FIG. 5 is a sequence diagram showing an example of processing of the control unit 11 according to an example embodiment. FIG. 6 is a diagram illustrating an example of data recorded in a configuration table 601 according to an example embodiment. FIG. 7 is a diagram illustrating an example of wavelengths output when power is supplied to the heater 124 based on each of a plurality of transitions. FIG. 8 is a diagram illustrating an example of transition when transition is made to target value Wt from power value lower than target value Wt. FIG. 9 is a diagram showing an example of transition when transition is set from power value to target value Wt which is higher than target value Wt.

In Step S101, the control unit 11 decides (specifies, determines) the wavelength (channel) of the light to be output from the wavelength tunable light source unit 12. Here, the control unit 11 may, for example, decide the wavelength of the light in accordance with an electrical signal from the transmission control unit 34.

Subsequently, based on the wavelength of the light output from the wavelength tunable light source unit 12, the control unit 11 determines the target value of the power to be supplied to the heater 124 and transition of the power to be supplied to the heater 124 until the target value is reached (Step S102). Thus, for example, an appropriate response characteristic can be obtained in accordance with the hysteresis (history phenomenon, history effect) of the waveguide 126 made of silicon etc.

Here, the control unit 11 may determine the power to be supplied to the heater 124 with reference to the configuration table 601 in FIG. 6. The control unit 11 may store the configuration table 601 for each heater 124. In this case, the control unit 11 may store a configuration table 601A for the heater 124A and a configuration table 601B for the heater 124B. The information to be shown in the configuration table 601 may be previously recorded in the control unit 11, for example.

In the example shown in FIG. 6, the wavelength, the target value, and the transition are recorded (configured, registered) in correspondence with the channel ID in the configuration table 601. The channel ID is, for example, identification information of a wavelength in wavelength division multiplexing communication. The wavelength is the wavelength of light of the channel pertaining to the channel ID. The target value is a target value (a target value, a set value) of the power to be supplied to the heater 124. Transition is information indicating transition of the value of the power to be supplied to the heater 124 until it reaches the target value. The information indicating transition may include, for example, information of the value of the power to be supplied at each point from the time of starting the power supply to the time of reaching the target value. Alternatively, the information indicating transition may include, for example, information indicating patterns of transition.

Even when the power of the same target value is supplied, at least one of the intensity and the wavelength of the light output based on the transition of the power to be supplied to the heater 124 may be different due to the hysteresis of the waveguide 126 made of silicon etc. Hysteresis is, for example, a change in the state of a system depending not only on the force applied at present but also on the force applied in the past.

FIG. 7 shows an example of a wavelength of light to be output when power is supplied to the heater 124 based on each of a plurality of transitions in order to output light of a specific wavelength (a desired wavelength) from the wavelength tunable light source unit 12. The line 711B shows the difference between the desired wavelength of light to be output and the wavelength of light that is actually output when the power supplied to the heater 124 is gradually decreased from about 0.7 mW to about 0 mW. The line 711A shows the intensity of the light output at that time. The line 712B shows the difference (a wavelength difference) between the desired wavelength of light to be output and the wavelength of light that is actually output when the power supplied to the heater 124 is gradually increased from about 1.1 mW to about 1.9 mW. The line 712A shows the intensity of the light output at that time.

The line 713B shows the difference between the desired wavelength of light to be output and the wavelength of light that is actually output when the power supplied to the heater 124 is gradually decreased from about 4.5 mW to about 2.1 mW. The line 713A shows the intensity of the light output at that time. The line 714B shows the difference between the desired wavelength of light to be output and the wavelength of light that is actually output when the power supplied to the heater 124 is gradually increased from about 4.9 mW to about 5.8 mW. The line 714A shows the intensity of the light output at that time.

As shown by the line 713B, when the power supplied to the heater 124 is gradually decreased from about 4.5 mW to about 2.1 mW, the difference between the desired wavelength of light to be output and the wavelength light that is actually output is 0 in power value 702 which is about 3.2 mW.

In addition, when the power supplied to the heater 124 is gradually decreased from about 4.5 mW to about 2.1 mW, as shown by the line 713A, transition of the intensity of the output light becomes a mountain shape and becomes a peak at the power value 702. Therefore, the response characteristic of the intensity of the light output from the wavelength tunable light source unit 12 can be stabilized by causing transition in which the power supplied to the heater 124 is changed from a power value higher than the power value 702 to the power value 702. Note that in FIG. 7, the broken line in the case of transition in which the power value is changed from a value lower than the power value 702 to the power value 702 is not shown because transition of the intensity of the output light does not have the desired shape (e.g., mountains). Note that the intensity of the output light may differ for each transition of the power supplied to the heater 124 for each of the plurality of desired wavelengths.

Subsequently, the control unit 11 supplies power from the power source to the heater 124 of the wavelength tunable light source unit 12 at the determined target value and transition (Step S103). Here, when the wavelength of the light output from the wavelength tunable light source unit 12 (the light output from the wavelength tunable laser apparatus 10) is the first wavelength, the control unit 11 may increase the power supplied to the heater 124 from the first power value to the first target value, which is lower than the first target value according to the first wavelength. Further, when the wavelength of the light output from the wavelength tunable light source unit 12 is the second wavelength different from the first wavelength, the control unit 11 may decrease the power supplied to the heater from the second power value to the second target value, which is higher than the second target value, according to the second wavelength.

Further, the control unit 11 may supply power to the heater 124, the power corresponding to a power (circulation power) at which the phase of the wavelength of the light output from the wavelength tunable light source unit 12 is circulated (the phase is shifted by 2π), and then cause the heater 124 to supply power based on the transition of the power corresponding to the wavelength until the target value of the power corresponding to the wavelength is reached. Thus, for example, hysteresis (history phenomenon, history effect) of the waveguide 126 made of silicon etc. is reduced (reset, initialized), and the wavelength of the light output from the wavelength tunable light source unit 12 to the outside can be appropriately controlled. It should be noted that hysteresis is, for example, a change in the state of a system depending not only on the force currently applied but also on the force applied in the past. The circulation power may be different for each wavelength of the light output from the wavelength tunable light source unit 12.

FIG. 8 shows an example of transition 801 of the power value at each time point when the value of the power supplied to the heater 124 transits from the value lower than the target value Wt to the target value Wt when reaching the target value Wt according to the desired wavelength. In the example illustrated in FIG. 8, the power supplied to the heater 124 increases from 0 mW to circulation power Ws in the period from the time point $t_0$ to the time point $t_1$, the power supplied to the heater 124 is constant in the period from the time point $t_1$ to the time point $t_2$, and the power supplied to the heater 124 decreases from the circulation power Ws to 0 mW in the period from the time point $t_2$ to time point $t_3$. The power supplied to the heater 124 is constant in the period from the time point $t_5$ to the time point $t_4$, increases from 0 mW, which is lower than target value Wt, to the target value Wt in the period from the time point $t_4$ to the time point $t_5$, and then becomes constant.

FIG. 9 illustrates an example of transition 901 of the power value at each time point when the value of the power supplied to the heater 124 transits from the power value higher than the target value Wt to the target value Wt when reaching the target value Wt according to the desired wavelength. In the example illustrated in FIG. 9, as in the example illustrated in FIG. 8, the power supplied to the heater 124 increases from 0 mW to circulation power Ws in the period from the time point $t_0$ to the time point $t_1$, and the power supplied to the heater 124 is constant in the period from the time point $t_1$ to the time point $t_2$. Thereafter, in the period from the time point $t_2$ to the time point $t_6$, the circuit power Ws, which is higher than the target value Wt, decreases to the target value Wt, and thereafter remains constant.

Modified Example

The control unit 11 may be implemented by, for example, one or more computers. Further, each part (each unit) of the wavelength tunable laser apparatus 10 and the optical transceiver 3 may be formed as a single module or as separate modules. When a plurality of units configure a single module, the plurality of units may be housed in the same cabinet, for example, or may be mounted on the same circuit board.

Note that the present disclosure is not limited to the above example embodiments, and may be suitably changed to the extent that it does not deviate from the gist of the present disclosure.

Some or all of the above example embodiments may be described as in the following supplementary notes, but it is not limited to the following.

Supplementary Note 1

A wavelength tunable laser apparatus comprising:
- a semiconductor optical amplifier that outputs light due to supplied power;
- a heater that controls a wavelength of the light output from the semiconductor optical amplifier by performing heating due to the supplied power; and
- a control unit configured to control power, the power being supplied to the heater,
- wherein the control unit determines, based on the wavelength of the light output from the wavelength tunable laser apparatus, a target value of the power to be supplied to the heater and transition of the power to be supplied to the heater until the target value is reached.

Supplementary Note 2

The wavelength tunable laser apparatus according to Supplementary Note 1, wherein
- when the wavelength of the light output from the wavelength tunable laser apparatus is a first wavelength, the control unit increases the power supplied to the heater from a first power value, which is lower than a first target value corresponding to the first wavelength, to the first target value, and
- when the wavelength of the light output from the wavelength tunable laser apparatus is a second wavelength different from the first wavelength, the control unit decreases the power supplied to the heater from a second power value, which is higher than a second target value corresponding to the second wavelength, to the second target value.

Supplementary Note 3

The wavelength tunable laser apparatus according to Supplementary Note 1 or 2, wherein the control unit is configured to store, in correspondence with each of the plurality of the wavelengths of the light output from the wavelength tunable laser apparatus, the target value of the power to be supplied to the heater and transition of the power to be supplied to the heater until the target value is reached.

Supplementary Note 4

The wavelength tunable laser apparatus according to any one of Supplementary Notes 1 to 3, wherein the control unit is configured to supply power to the heater, the power corresponding to a circulation power at which the phase of the wavelength of the light output from the wavelength tunable light source unit is circulated, and then cause the heater to supply power based on the transition of the power corresponding to the wavelength until a target value of the power corresponding to the wavelength is reached.

Supplementary Note 5

The wavelength tunable laser apparatus according to any one of Supplementary Notes 1 to 4, wherein the heater changes the refractive index of the light output from the semiconductor optical amplifier by heating the silicon optical waveguide.

Supplementary Note 6

An optical transceiver comprising:
- an optical receiver module for receiving an optical signal;
- a wavelength tunable laser apparatus;
- an optical cable interface for transmitting light from the wavelength tunable laser apparatus;
- an electrical interface for transmitting and receiving electrical signals; and
- a transmission control unit configured to convert an optical signal into an electrical signal to be output from the electrical interface when the optical signal is received by the optical receiver module, and convert an electrical signal into an optical signal to be output from the optical cable interface when the electrical signal is received by the electrical interface,
- wherein the wavelength tunable laser apparatus includes:
  - a semiconductor optical amplifier that outputs light due to the supplied power;
  - a heater that controls a wavelength of the light output from the semiconductor optical amplifier by performing heating due to the supplied power; and
  - a control unit configured to control power, the power being supplied to the heater,
- wherein the control unit determines, based on the wavelength of the light output from the wavelength tunable laser apparatus, a target value of the power to be supplied to the heater and transition of the power to be supplied to the heater until the target value is reached.

Supplementary Note 7

The optical transceiver according to Supplementary Note 6, wherein
- when the wavelength of the light output from the wavelength tunable laser apparatus is a first wavelength, the control unit increases the power supplied to the heater from a first power value, which is lower than a first target value corresponding to the first wavelength, to the first target value, and when the wavelength of the light output from the wavelength tunable laser apparatus is a second wavelength different from the first wavelength, the control unit decreases the power supplied to the heater from a second power value which is higher than a second target value corresponding to the second wavelength, to the second target value.

Supplementary Note 8

A wavelength control method comprising:
causing a wavelength tunable laser apparatus that includes:
a semiconductor optical amplifier that outputs light due to supplied power; and
a heater that controls a wavelength of the light output from the semiconductor optical amplifier by performing heating due to the supplied power
perform processes of:
determining, based on the wavelength of the light output from the wavelength tunable laser apparatus, a target value of the power to be supplied to the heater and transition of the power to be supplied to the heater until the target value is reached; and
supplying power to the heater based on the determined transition.

REFERENCE SIGNS LIST

1 COMMUNICATION SYSTEM
2 COMMUNICATION APPARATUS
3 OPTICAL TRANSCEIVER
10 WAVELENGTH TUNABLE LASER APPARATUS
11 CONTROL UNIT
12 WAVELENGTH TUNABLE LIGHT SOURCE UNIT
31A OPTICAL CABLE INTERFACE
31B OPTICAL CABLE INTERFACE
32 OPTICAL RECEIVER MODULE
34 TRANSMISSION CONTROL UNIT
35 ELECTRICAL INTERFACE
121 SEMICONDUCTOR OPTICAL AMPLIFIER
122 RESONATOR
123A MIRROR
123B MIRROR
124 HEATER
125 SEMICONDUCTOR OPTICAL AMPLIFIER
126 WAVEGUIDE
127 WAVELENGTH LOCKER
128 MODULATOR
601 CONFIGURATION TABLE

The invention claimed is:

1. A wavelength tunable laser apparatus comprising:
a semiconductor optical amplifier that outputs light due to supplied power;
a silicon optical waveguide;
a heater that controls a wavelength of the light output from the semiconductor optical amplifier by performing heating of the silicon optical waveguide due to the supplied power; and
a control unit configured to control power, the power being supplied to the heater,
wherein the control unit determines, based on the wavelength of the light output from the wavelength tunable laser apparatus, a target value of the power to be supplied to the heater and transition of the power to be supplied to the heater until the target value is reached, and
wherein the control unit is configured to supply power to the heater, the power corresponding to a circulation power at which a phase of the wavelength of the light output from the wavelength tunable laser apparatus is circulated by shifting the phase by $2\pi$ to reset a hysteresis of the silicon optical waveguide, and then cause the heater to supply power based on the transition of the power corresponding to the wavelength until a target value of the power corresponding to the wavelength is reached.

2. The wavelength tunable laser apparatus according to claim 1, wherein
when the wavelength of the light output from the wavelength tunable laser apparatus is a first wavelength, the control unit increases the power supplied to the heater from a first power value, which is lower than a first target value corresponding to the first wavelength, to the first target value, and
when the wavelength of the light output from the wavelength tunable laser apparatus is a second wavelength different from the first wavelength, the control unit decreases the power supplied to the heater from a second power value, which is higher than a second target value corresponding to the second wavelength, to the second target value.

3. The wavelength tunable laser apparatus according to claim 1, wherein the control unit is configured to store, in correspondence with each of the plurality of the wavelengths of the light output from the wavelength tunable laser apparatus, the target value of the power to be supplied to the heater and transition of the power to be supplied to the heater until the target value is reached.

4. The wavelength tunable laser apparatus according to claim 1, wherein the heater changes the refractive index of the light output from the semiconductor optical amplifier by heating the silicon optical waveguide.

5. An optical transceiver comprising:
an optical receiver module for receiving an optical signal;
a wavelength tunable laser apparatus;
an optical cable interface for transmitting light from the wavelength tunable laser apparatus;
an electrical interface for transmitting and receiving electrical signals; and
a transmission control unit configured to convert an optical signal into an electrical signal to be output from the electrical interface when the optical signal is received by the optical receiver module, and convert an electrical signal into an optical signal to be output from the optical cable interface when the electrical signal is received by the electrical interface,
wherein the wavelength tunable laser apparatus includes:
a semiconductor optical amplifier that outputs light due to the supplied power;
a silicon optical waveguide;
a heater that controls a wavelength of the light output from the semiconductor optical amplifier by performing heating of the silicon optical waveguide due to the supplied power; and
a control unit configured to control power, the power being supplied to the heater,
wherein the control unit determines, based on the wavelength of the light output from the wavelength tunable laser apparatus, a target value of the power to be supplied to the heater and transition of the power to be supplied to the heater until the target value is reached, and wherein the control unit is configured to supply power to the heater, the power corresponding to a circulation power at which a phase of the wavelength of the light output from the wavelength tunable laser apparatus is circulated by shifting the phase by 2π to reset a hysteresis of the silicon optical waveguide, and then cause the heater to supply power based on the transition of the power corresponding to the wavelength until a target value of the power corresponding to the wavelength is reached.

6. The optical transceiver according to claim 5, wherein when the wavelength of the light output from the wavelength tunable laser apparatus is a first wavelength, the control unit increases the power supplied to the heater from a first power value, which is lower than a first target value corresponding to the first wavelength, to the first target value, and when the wavelength of the light output from the wavelength tunable laser apparatus is a second wavelength different from the first wavelength, the control unit decreases the power supplied to the heater from a second power value which is higher than a second target value corresponding to the second wavelength, to the second target value.

7. A wavelength control method comprising:

causing a wavelength tunable laser apparatus that includes:

a semiconductor optical amplifier that outputs light due to supplied power;

a silicon optical waveguide; and a heater that controls a wavelength of the light output from the semiconductor optical amplifier by performing heating of the silicon optical waveguide due to the supplied power perform processes of:

determining, based on the wavelength of the light output from the wavelength tunable laser apparatus, a target value of the power to be supplied to the heater and transition of the power to be supplied to the heater until the target value is reached; and supplying power to the heater based on the determined transition, by supplying power to the heater, the power corresponding to a circulation power at which a phase of the wavelength of the light output from the wavelength tunable laser apparatus is circulated by shifting the phase by 2π to reset a hysteresis of the silicon optical waveguide, and then cause the heater to supply power based on the transition of the power corresponding to the wavelength until a target value of the power corresponding to the wavelength is reached.

* * * * *